United States Patent
Park et al.

(10) Patent No.: US 12,165,890 B2
(45) Date of Patent: Dec. 10, 2024

(54) DISPENSER FOR MICRO LED SUSPENSION AND METHOD OF TRANSFERRING MICRO LED

(71) Applicant: SAMSUNG ELECTRONICS CO., LTD., Suwon-si (KR)

(72) Inventors: Joonyong Park, Suwon-si (KR); Dongho Kim, Seoul (KR); Hyunjoon Kim, Seoul (KR); Seogwoo Hong, Yongin-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 17/469,390

(22) Filed: Sep. 8, 2021

(65) Prior Publication Data
US 2022/0246448 A1    Aug. 4, 2022

Related U.S. Application Data

(60) Provisional application No. 63/145,186, filed on Feb. 3, 2021.

(30) Foreign Application Priority Data

Apr. 16, 2021    (KR) .................... 10-2021-0050014

(51) Int. Cl.
*H01L 21/67*    (2006.01)
*H01L 21/673*    (2006.01)
*H01L 33/00*    (2010.01)

(52) U.S. Cl.
CPC .. *H01L 21/67144* (2013.01); *H01L 21/67017* (2013.01); *H01L 21/67253* (2013.01); *H01L 21/673* (2013.01); *H01L 33/005* (2013.01)

(58) Field of Classification Search
CPC ......... H01L 21/67144; H01L 21/67017; H01L 21/673; H01L 33/005; H01L 2224/75655; H01L 2224/95101; H01L 2924/12041
See application file for complete search history.

(56) References Cited

U.S. PATENT DOCUMENTS 7,080,444 B1    7/2006    Craig et al.
10,242,977 B2   3/2019    Sasaki et al.
(Continued)

FOREIGN PATENT DOCUMENTS

| CN | 112133210 A | * | 12/2020 | ............... G09F 9/33 |
| CN | 113226776 A | * | 8/2021 | ............... B41J 2/11 |

(Continued)

OTHER PUBLICATIONS

Communication issued Sep. 9, 2024 by the Korean Intellectual Property Office in Korean Patent Application No. 10-2021-0050014.

*Primary Examiner* — Jeffrey T Carley
(74) *Attorney, Agent, or Firm* — Sughrue Mion, PLLC

(57) ABSTRACT

Provided is a dispenser for a solution including a reservoir configured to hold a suspension of micro light-emitting diodes (LEDs) suspended in a solvent; a stirrer configured to stir the suspension in the reservoir; a discharge path including a first valve configured to control outflow of the suspension from the reservoir; a filling path including a second valve configured to control inflow of the suspension into the reservoir; a hydraulic path including a third valve configured to control a pressure inside the reservoir; and a washing path connected to the first valve and configured to input a washing fluid for washing the discharge path into the discharge path, wherein the first valve includes a multi-way valve configured to selectively connect the discharge path to one of the reservoir and the washing path.

14 Claims, 16 Drawing Sheets

(56) References Cited

U.S. PATENT DOCUMENTS

| | | | |
|---|---|---|---|
| 10,243,097 B2 | 3/2019 | Yuen | |
| 10,361,337 B2 | 7/2019 | Ahmed et al. | |
| 11,942,450 B2* | 3/2024 | Haupt | H01L 24/95 |
| 2005/0056713 A1* | 3/2005 | Tisone | B01D 19/0047 |
| | | | 239/690 |
| 2006/0202943 A1* | 9/2006 | Hillis | G09G 3/2085 |
| | | | 345/55 |
| 2007/0269914 A1 | 11/2007 | Yeh et al. | |
| 2012/0161338 A1* | 6/2012 | Lowenthal | H10K 59/805 |
| | | | 257/E23.116 |
| 2014/0312332 A1* | 10/2014 | Lowenthal | H01L 31/105 |
| | | | 257/40 |
| 2016/0214148 A1* | 7/2016 | Okutani | H01L 21/67017 |
| 2016/0380158 A1* | 12/2016 | Sasaki | H01L 24/95 |
| | | | 257/89 |
| 2017/0133558 A1* | 5/2017 | Sasaki | H10K 59/00 |
| 2017/0372927 A1* | 12/2017 | Schuele | H01L 29/0657 |
| 2018/0029038 A1* | 2/2018 | Sasaki | G09G 3/006 |
| 2018/0076068 A1 | 3/2018 | Yuen | |
| 2018/0102352 A1 | 4/2018 | Saski et al. | |
| 2019/0058080 A1 | 2/2019 | Ahmed et al. | |
| 2019/0080937 A1* | 3/2019 | Tsuchiya | H01L 21/67253 |
| 2020/0139373 A1 | 5/2020 | Sasaki et al. | |
| 2020/0286870 A1 | 9/2020 | Sasaki et al. | |
| 2022/0072864 A1 | 3/2022 | Kim et al. | |
| 2022/0161566 A1* | 5/2022 | Park | H01L 33/24 |
| 2023/0163007 A1 | 5/2023 | Yang et al. | |

FOREIGN PATENT DOCUMENTS

| | | | |
|---|---|---|---|
| JP | 4613489 B2 | | 1/2011 |
| JP | 5303232 B2 | | 10/2013 |
| JP | 6694222 B1 | * | 5/2020 |
| JP | 2020-203463 A | | 12/2020 |
| KR | 10-2004-0104914 A | | 12/2004 |
| KR | 101730977 B1 | * | 4/2017 |
| KR | 10-2017-0086837 A | | 7/2017 |
| KR | 10-2020-0021970 A | | 3/2020 |
| KR | 10-2020-0079378 A | | 7/2020 |

* cited by examiner

DISPENSER FOR MICRO LED SUSPENSION AND METHOD OF TRANSFERRING MICRO LED

CROSS-REFERENCE TO RELATED APPLICATIONS

This application claims the benefit of U.S. Provisional Application No. 63/145,186, filed on Feb. 3, 2021, in the United States Patent and Trademark Office, and Korean Patent Application No. 10-2021-0050014, filed on Apr. 16, 2021, in the Korean Intellectual Property Office, the disclosures of which are incorporated by reference herein in their entireties.

BACKGROUND

1. Field

The disclosure relates to a dispenser for a micro light-emitting diode (LED) suspension and a method of transferring a micro LED.

2. Description of Related Art

In order to implement a micro LED display, it is necessary to transfer a micro LED to each display pixel and electrically connect the micro LED. Existing micro LED transfer methods include a pick and place method. Recently, a method of transferring a solution in which micro LEDs are suspended onto a substrate to transfer the micro LEDs has been proposed and this may be referred to as a fluidic self-assembly (FSA). The FSA is more advantageous in large-area scalability and flexible/wearable scalability, compared to the methods mentioned above.

In the FSA, a solution in which the micro LEDs are suspended is discharged onto a substrate, and the micro LEDs are then placed in or transferred to pixels by various forces. Thus, it is very important to uniformly discharge the micro LED solution to the entire substrate in consideration of final productivity and quality of an outcome. In particular, if the mass concentration of the solution in which the micro LEDs are suspended is changed or a discharge path is clogged due to a micro LED remaining in the discharge path, uniformity of discharge may be degraded.

SUMMARY

Example embodiments provide dispensers for a micro light-emitting diode (LED) suspension and methods of transferring a micro LED to of uniformly discharge a micro LED suspension onto a substrate.

Additional aspects will be set forth in part in the description which follows and, in part, will be apparent from the description, or may be learned by practice of embodiments of the disclosure.

According to an aspect of an example embodiment, a dispenser for a solution includes a reservoir configured to hold a suspension of micro light-emitting diodes (LEDs) suspended in a solvent; a stirrer configured to stir the suspension in the reservoir; a discharge path including a first valve configured to control outflow of the suspension from the reservoir; a filling path including a second valve configured to control inflow of the suspension into the reservoir; a hydraulic path including a third valve configured to control a pressure inside the reservoir; and a washing path connected to the first valve and configured to input a washing fluid for washing the discharge path into the discharge path, wherein the first valve includes a multi-way valve configured to selectively connect the discharge path to one of the reservoir and the washing path. The micro LEDs may have a size of about 1 □m to about 500 □m, and the solvent may include at least one of water, alcohol, polyol, ketone, halocarbon, acetone, flux, a surfactant, and an organic solvent.

The first valve, the second valve, and the third valve may be configured such that when the first valve is opened with respect to the reservoir, the second valve is closed and the third valve is opened, the suspension is discharged from the reservoir through the discharge path.

The first valve, the second valve, and the third valve may be configured such that when the first valve is closed with respect to the reservoir, the second valve is open, and the third valves is open, the suspension is input into the reservoir through the filling path.

The first valve, the second valve, and the third valve may be configured such that when the first valve is closed with respect to the reservoir, the second valve is close, and the third valves is closed, the suspension is maintained in the reservoir.

The first valve may be configured to be opened with respect to the washing path to input the washing fluid into the discharge path to remove any remaining micro LEDs present in the discharge path.

The second valve and the third value may be configured to be open to input the suspension to the reservoir through the filling path while the remaining micro LEDs are removed.

The washing fluid may include at least one of gas, water, ethanol, and a surfactant.

The dispenser may further include a sprayer disposed at an end of the discharge path, the sprayer being configured to spray the suspension being discharged through the discharge path.

The dispenser may further include a plurality of discharge paths.

The dispenser may further including a gantry connected to the dispenser, the gantry being configured to move by at least one of a translation and a rotation on a substrate, wherein the discharge path is configured to discharge the suspension onto the substrate.

The micro LEDs may be aligned on the substrate in a fluidic self-assembly (FSA) manner when the suspension is discharged onto the substrate.

The substrate may include wells which are configured to receive the micro LEDs.

The stirrer may include at least one of an impeller and a magnetic bar, and the impeller may include at least one of a paddle, a propeller, a screw, and a turbine.

According to an aspect of an example embodiment, a dispenser for a solution, the dispenser includes: a reservoir configured to hold a suspension of micro light-emitting diodes (LEDs) suspended in a solvent; a stirrer configured to stir the suspension in the reservoir; a discharge path including a first valve configured to control outflow of the suspension from the reservoir; a filling path including a second valve configured to control inflow of the suspension to the reservoir; a hydraulic path including a third valve configured to control a pressure inside the reservoir; and a washing path connected to the discharge path, the washing path including a fourth valve configured to control an introduction of a washing fluid into the discharge path from the washing path.

According to an aspect of an example embodiment, a method of transferring a micro light-emitting diode (LED), the method includes: discharging the suspension of micro LEDs onto a substrate through the discharge path of the dispenser; and aligning the discharged micro LEDs in wells of the substrate in a fluidic self-assembly (FSA) manner.

The method may further include at least one of: washing the discharge path; and inputting the solution into the reservoir of the dispenser.

The washing may include opening the first valve with respect to the washing path and introducing the washing fluid to remove remaining micro LEDs present in the discharge path, and the inputting the solution into the reservoir may include opening the third valve and opening the second valve to supply the suspension.

The discharging the suspension may include discharging the suspension through the discharge path by opening the third valve and opening the first valve with respect to the reservoir.

The substrate may include an interposer used to transfer the micro LEDs to another substrate or a driving substrate including a driving layer.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
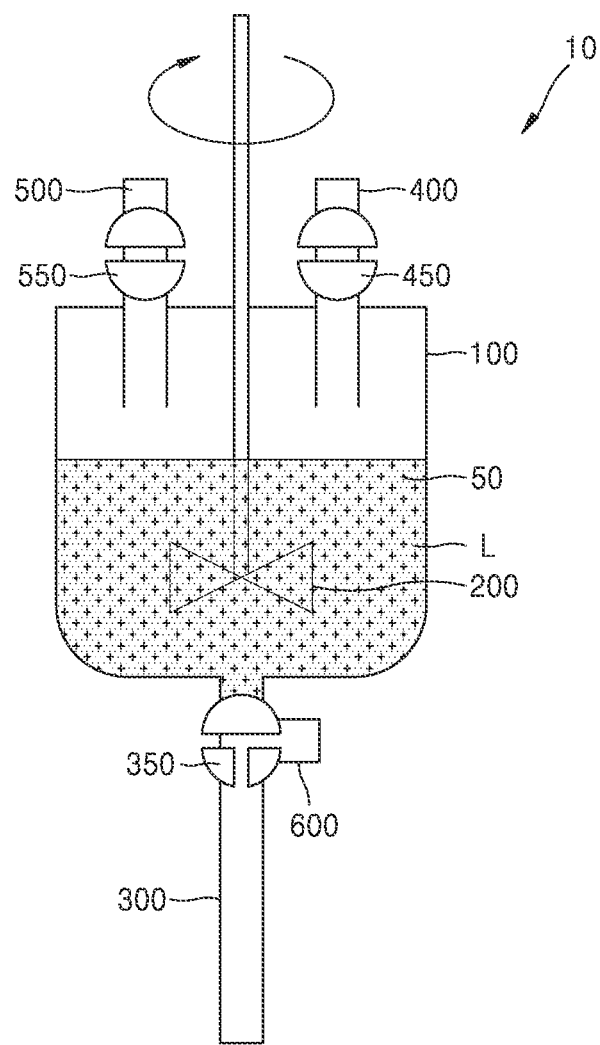
FIG. 1 illustrates a case in which a dispenser for a solution according to an example embodiment is in a standby mode.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, embodiments will be described in detail with reference to the accompanying drawings. The described embodiments are merely examples, and various modifications may be made from these embodiments. Like reference numerals in the drawings denote like elements, and, in the drawings, the sizes of elements may be exaggerated for clarity and for convenience of explanation.

Hereinafter, when it is described that a certain component is "above" or "on" another component, the certain component may be directly above another component, or a third component may be interposed therebetween.

An expression in the singular includes an expression in the plural unless they are clearly different from each other in context. In addition, when a certain part "includes" a certain component, this indicates that the part may further include another component instead of excluding another component unless there is different disclosure.

The use of the term "the" and similar referential terms may refer to both the singular and the plural.

The meaning of "connection" may include a physical connection as well as an optical connection.

In addition, the use of all example terms (e.g., etc.) is merely for describing technical ideas in detail, and the scope of the disclosure is not limited by these terms unless limited by claims.

Although terms, such as "first" and "second", may be used to describe various elements, the elements cannot be limited by the terms. The terms may be used only to distinguish a certain element from another element.

FIG. 1 is a view illustrating a dispenser 10 for a solution according to an example embodiment.

According to FIG. 1, the dispenser 10 for a solution according to an example embodiment may include a reservoir 100 in which a micro LED suspension L is stored, a stirrer 200 stirring the suspension L in the reservoir 100, a discharge path 300 in which is provided a first valve 350 for controlling discharge of the suspension L in the reservoir 100 to the outside, a filling path 400 in which a second valve 450 is provided for controlling filling of the micro LED suspension L into the reservoir 100, a hydraulic path 500 in which a third valve 550 is provided for controlling internal pressure of the reservoir 100, and a washing path 600 connected to the discharge path 300 through the first valve 350 and allowing a washing fluid F for washing the discharge path 300 to be introduced therethrough.

The micro LED suspension L may be stored in the reservoir 100, and the stored micro LED suspension L may be stirred in the reservoir 100. The reservoir 100 may be connected to the discharge path 300 in a direction of gravity and may also be connected thereto in a direction other than the direction of gravity. For example, the discharge path 300 may be connected to a lower portion of the reservoir 100, and the discharge path 300 may also be connected to a side portion of the reservoir 100. The reservoir 100 may include (e.g., may be made of) a material that is not crushed even in a vacuum state.

The micro LED 50 may be suspended in the micro LED suspension L. The suspension solvent may include, for example, one or a combination from among water, alcohol, polyol, ketone, halocarbon, acetone, flux and an organic solvent, and may include a certain amount of surfactant. The micro LED 50 may have a size of 1000 μm or less, and preferably 200 μm or less.

The stirrer 200 may be located in the reservoir 100 to stir the micro LED suspension L stored in the reservoir 100. As the suspension L is stirred, the micro LEDs 50 and the suspension L solvent may be uniformly mixed. The stirrer 200 may be an impeller or a magnetic bar. When the stirrer 200 is an impeller, the stirrer 200 may further include a fixed rod, and the impeller may include a plurality of blades. For example, the impeller may have a shape such as a paddle shape, a propeller shape, a screw shape, or a turbine shape. The shape of the impeller may be appropriately selected according to viscosity and capacity of the suspension L. When the stirrer 200 body is an impeller, a motor may be installed in the impeller or a fixed rod, or may be connected from an external motor. When the stirrer 200 is a magnetic bar, the stirrer 200 may include a ferromagnetic material. A device providing a magnetic force to rotate the magnetic bar may be provided near the reservoir 100. Alternatively, the reservoir 100 may include a device providing a magnetic force. A rotation period of the stirrer 200 may be appropriately selected depending on a type, concentration, viscosity, etc. of the suspension L.

The discharge path 300 is a path through which the micro LED suspension L is discharged to a substrate. The first valve 350 may be disposed in the discharge path 300, and the first valve 350 may be a multi-way valve. For example, the first valve 350 may be a three-way valve. When the first valve 350 is a multi-way valve, discharge of the micro LED suspension L may be controlled according to opening and closing of the first valve 350. When the first valve 350 is a multi-way valve, the discharge path 300 may be connected to the washing path 600 through the first valve 350. The first valve 350 may selectively open the discharge path 300 to any one of the reservoir 100 or the washing path 600. In an example embodiment, opening of the discharge path 300 and the reservoir 100 through the first valve 350 may mean that the discharge path 300 is closed with respect to the washing path 600. Also, opening of the discharge path 300 and the washing path 600 through the first valve 350 may mean that the discharge path 300 is closed with respect to the reservoir 100. Discharge of the micro LED suspension L onto the substrate may be controlled through the first valve 350. However, the first valve 350 is not limited to a multi-way valve and may be a two-way valve. For example, when the first valve 350 is a two-way valve, discharge of the micro LED suspension L may be controlled according to opening and closing of the first valve 350.

A single discharge path 300 may be connected to the reservoir 100, or a plurality of discharge paths 300 may be connected to the reservoir 100. When a plurality of discharge paths 300 are provided, each discharge path 300 may include a valve corresponding to the first valve 350. Here, the valves may be controlled separately or may be controlled at the same time.

The filling path 400 is a path through which the micro LED suspension L may be supplied into the reservoir 100. The second valve 450 may be disposed in the filling path 400, and the second valve 450 may be a two-way valve. Supply of the micro LED suspension L into the reservoir 100 may be controlled according to opening and closing of the second valve 450. For example, the second valve 450 is normally closed, but when the second valve 450 is opened, the micro LED suspension L may be supplied to the reservoir 100 through the filling path 400.

Figure 2:
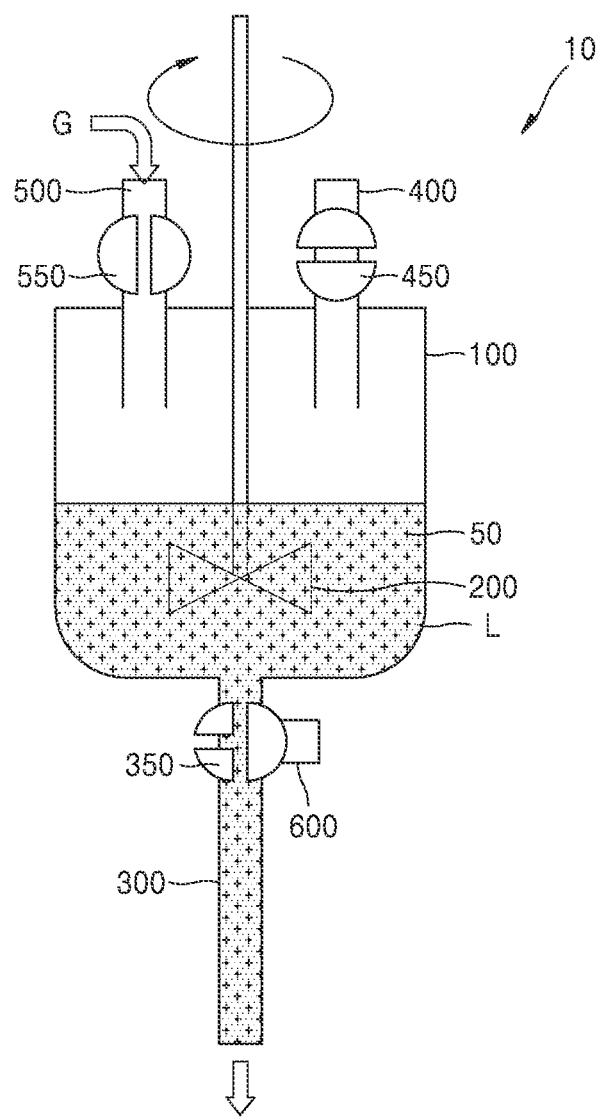
FIG. 2 illustrates a dispenser for a solution in a discharge mode according to an example embodiment.

The hydraulic path 500 is a path for controlling pressure of a gas G in the reservoir 100 (see, e.g., FIG. 2). The third valve 550 may be disposed in the hydraulic path 500, and the third valve 550 may be a two-way valve. When the third valve 550 is opened, the gas G may be injected into or drawn out from the reservoir 100, and when the third valve 550 is closed, the gas G in the reservoir 100 may stop moving. For example, normally, the third valve 550 is closed, but when the micro LED suspension L is discharged, the third valve 550 may be opened and the gas G may be injected into the reservoir 100. Here, because the gas G is injected at the same time when the micro LED suspension L is discharged, the micro LED suspension L may be induced to be discharged uniformly at a constant pressure. Alternatively, when the micro LED suspension L is supplied into the reservoir 100, the third valve 550 may be opened to allow the gas G in the reservoir 100 to be drawn out to induce a vacuum state or a low-pressure state. The gas G may be air or an inert gas, but is not limited thereto, and various gases may be used.

The washing path 600 may be connected to the discharge path 300, and a washing fluid F for washing may be introduced through the washing path 600. A micro LED 50 remaining in the discharge path 300 may be removed according to flow of the washing fluid F. When the first valve 350 is a multi-way valve, the washing path 600 may be connected to the discharge path 300 through the first valve 350. Alternatively, when the first valve 350 is a two-way valve, the washing path 600 may be connected to the discharge path 300 through a fourth valve different from the first valve 350. The washing fluid F is introduced through the washing path 600 to remove the micro LED 50 remaining in the discharge path 300, thereby preventing the discharge path 300 from being blocked. The washing fluid F may be the same as a suspension solvent or may be different. For example, the washing fluid F may include water, ethanol, a certain amount of a surfactant, etc. as a solvent, but is not limited thereto, and various liquids may be used. In addition, the washing fluid F may include, for example, a gas, and the gas may be air or an inert gas, but is not limited thereto, and various gases may be used. By removing the micro LED 50 remaining in the discharge path 300, the micro LED suspension L may be uniformly discharged through the discharge path 300 even if discharging of the micro LED suspension L is performed several times. Such uniform discharge may increase fixing yield by increasing a pixel position matching probability of the micro LED 50 when the micro LED suspension L is discharged onto the substrate.

A state of the dispenser 10 in which the first valve 350 is a multi-way valve and opens the discharge path 300 with respect to the reservoir 100 may correspond to a state in which the first valve is a two-way valve, the first valve 350 is opened and the fourth valve is closed. In addition, a state of the dispenser 10 in which the discharge path 300 is opened with respect to the washing path 600 through the first valve 350 may correspond to a state in which the first valve 350 is two-way valve, the first valve 350 is closed and the fourth valve is opened.

Next, a mode of the dispenser 10 for a solution according to opening and closing states of the first to third valves 350, 450, and 550 will be described.

Figure 3:
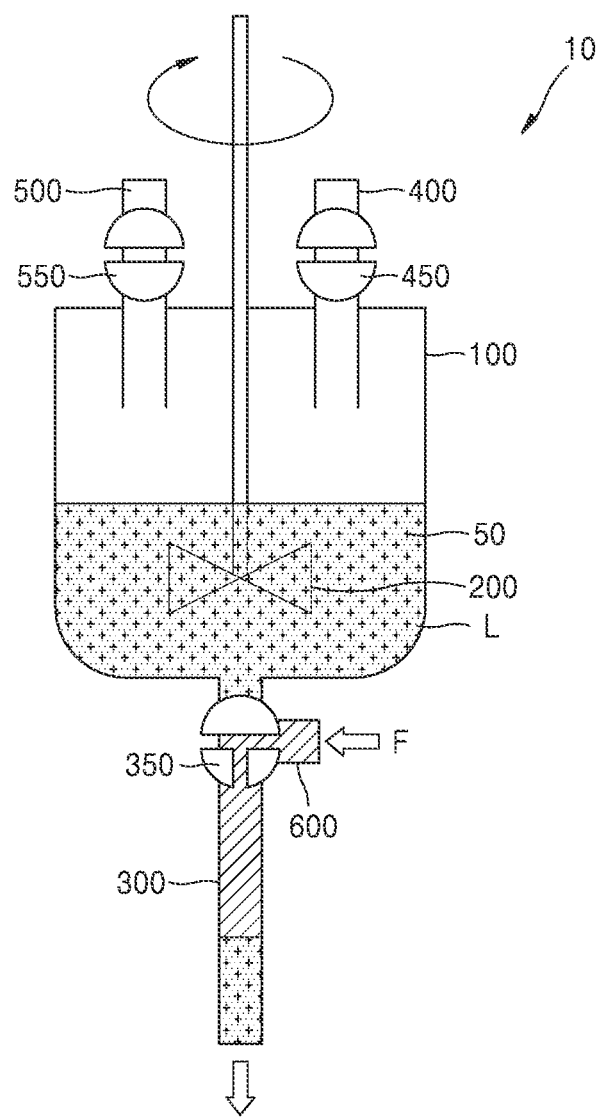
FIG. 3 illustrates a dispenser for a solution washed in a standby mode according to an example embodiment.
Figure 4:
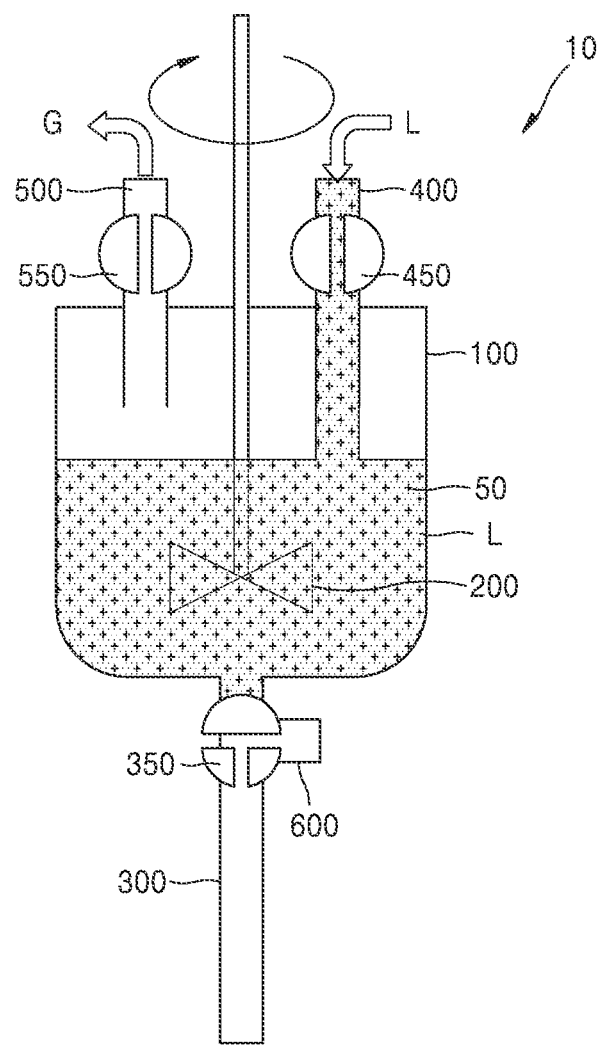
FIG. 4 illustrates a dispenser for a solution in a filling mode according to an example embodiment.

FIG. 1 illustrates the dispenser 10 for a solution according to an example embodiment in the standby mode, FIG. 2 illustrates the dispenser 10 for a solution in the discharge mode, FIG. 3 illustrates the dispenser 10 for a solution washed in the standby mode, and FIG. 4 illustrates the dispenser 10 for a solution in the filling mode.

The dispenser 10 for a solution according to an example embodiment illustrated in FIGS. 1 to 4 corresponds to a case in which the first valve 350 is a multi-way valve, but embodiments of the present disclosure are not limited thereto and the first valve 350 may be a two-way valve and a fourth valve may be separately located in the washing path 600.

Referring back to FIG. 1, in the standby mode, the discharge path 300 may be closed with respect to the reservoir 100 through the first valve 350 and the second and third valves 450 and 550 may be closed. In the standby mode, the micro LED suspension L may be stirred by the stirrer 200, and the micro LED suspension L may be maintained at a constant concentration. In the standby mode, the discharge path 300 may be washed, which will be described later with reference to FIG. 3.

Referring to FIG. 2, in the discharge mode, the discharge path 300 may be opened with respect to the reservoir 100 through the first valve 350, the second valve 450 may be closed, and the third valve 550 may be opened. When the discharge path 300 is opened with respect to the reservoir 100 through the first valve 350, the micro LED suspension L may be discharged from the reservoir 100 onto the substrate. Even in the discharge mode, the micro LED suspension L may be continuously stirred by the stirrer 200, and the micro LED suspension L may be maintained at the constant concentration. When the third valve 550 is opened, the gas G such as air may be injected into the reservoir 100 through the hydraulic path 500. When the discharge path 300 is opened with respect to the reservoir 100 through the first valve 350 while the second and third valves 450 and 550 are closed, the micro LED suspension L may be discharged, and thus, pressure of the gas G inside the reservoir 100 may be lowered. In this case, the amount of micro LED suspension L discharged per hour may not be constant. In consideration of this, the third valve may be opened so that the gas G such as air may be injected into the reservoir 100 through the hydraulic path 500 and a constant pressure may be applied to the micro LED suspension L. When the pressure of the gas G inside the reservoir 100 is constant, the amount of micro LED suspension L discharged per hour may be maintained to be constant. The amount of the micro LED suspension L discharged per hour may be controlled according to the pressure of the gas G injected through the hydraulic path 500. For example, if the pressure of the gas G is high, the amount of the micro LED suspension L discharged per hour may increase.

The micro LEDs 50 of the discharged suspension L may be aligned on the substrate in a fluidic self-assembly (FSA) manner. The substrate may include a plurality of wells in which the micro LED 50 may be fixed. The discharged micro LEDs 50 may be automatically fixed in the wells or may be fixed in the wells using a member such as a blade, a roller, or an absorber.

Referring to FIG. 3, in the standby mode, the discharge path 300 may be closed with respect to the reservoir 100 through the first valve 350, and the second and third valves 450 and 550 may be closed. Here, the discharge path 300 may be opened with respect to the washing path 600, and as the washing fluid F is introduced through the washing path 600, the discharge path 300 may be washed. Even during washing, the micro LED suspension L may be continuously stirred by the stirrer 200, and the micro LED suspension L may be maintained at a constant concentration in the reservoir 100. The washing fluid F may be introduced through the washing path 600 and the micro LEDs 50 remaining in the discharge path 300 may be removed. If the micro LEDs 50 continue to remain in the discharge path 300, the discharge path 300 may be partially or entirely closed by the remaining micro LEDs 50, and accordingly, the amount of solution discharged per hour may be non-uniform and fixing yield may be lowered. When the micro LEDs 50 remaining in the discharge path 300 are removed through the washing path 600, a constant discharge amount per hour may be maintained even after several discharge processes, thereby increasing fixing yield. The washing fluid F may be the same as the micro LED suspension L solvent or may be different. The gas introduced through the washing path 600 may be air or an inert gas. When washing is performed with the washing fluid F, the washing fluid F and the remaining micro LEDs 50 are discharged from the discharge path 300, and thus, washing may be performed when the dispenser 10 for a solution is not positioned on the substrate. The removed micro LEDs 50 may be filtered from the washing fluid F and re-suspended in the suspension solvent.

Referring to FIG. 4, in the filling mode, the first valve 350 of the discharge path 300 may be closed with respect to the reservoir 100, and the second and third valves 450 and 550 may be opened. The micro LED suspension L may be supplied into the reservoir 100 through the filling path 400. When a series of discharge modes is finished, the micro LED suspension L may be supplied to fill the reservoir 100. Even in the filling mode, the micro LED suspension L may be continuously stirred by the stirrer 200, and the micro LED suspension L may be maintained at a constant concentration in the reservoir 100. In the filling mode, as the micro LED suspension L is supplied to the reservoir 100, a volume of the gas G inside the reservoir 100 may be reduced and thus pressure of the gas G may increase. To prevent an increase in pressure of the gas G, the gas G inside the reservoir 100 may be drawn out through the hydraulic path 500 in which the third valve 550 is opened, to induce a vacuum state or a low-pressure state.

The filling mode and washing may be compatible. In other words, washing of the discharge path 300 may be performed even in the filling mode. Washing is related to the discharge passage 300 being opened with respect to the cleaning passage 600 and closed with respect to the reservoir 100 by the first valve 350, and thus, washing may be performed regardless of the opening and closing of the second valve 450 and the third valve 550.

In addition, the second valve 450 may be opened even during the discharge mode to supply the micro LED suspension L. Here, if a discharge amount of the discharge path 300 per hour and an amount of the micro LED suspension L supplied to the reservoir 100 per hour are the same, even when the third valve 550 is closed, an internal pressure of the reservoir 100 may be maintained to be constant, and thus, the discharge amount may be constant.

Figure 5:
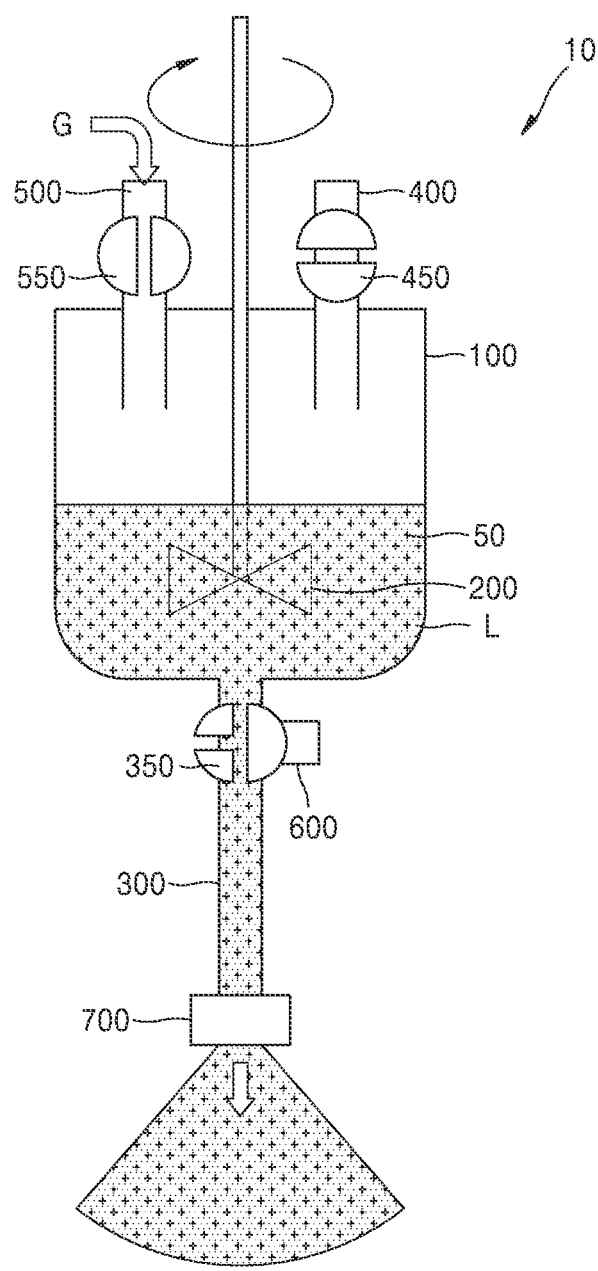
FIG. 5 is a view illustrating a dispenser for a solution according to an example embodiment.

FIG. 5 is a view illustrating a dispenser 10 for a solution according to an example embodiment.

Referring to FIG. 5, the dispenser 10 for a solution may further include a sprayer 700 for spraying a suspension at the end of the discharge path 300. Because the sprayer 700 is further provided, the micro LED suspension L may be evenly discharged to the substrate of a larger area. The sprayer 700 may further include an angle controller for controlling the spray angle. Discharge of the micro LED suspension L may be controlled by controlling the spray angle through the angle controller.

Figure 6:
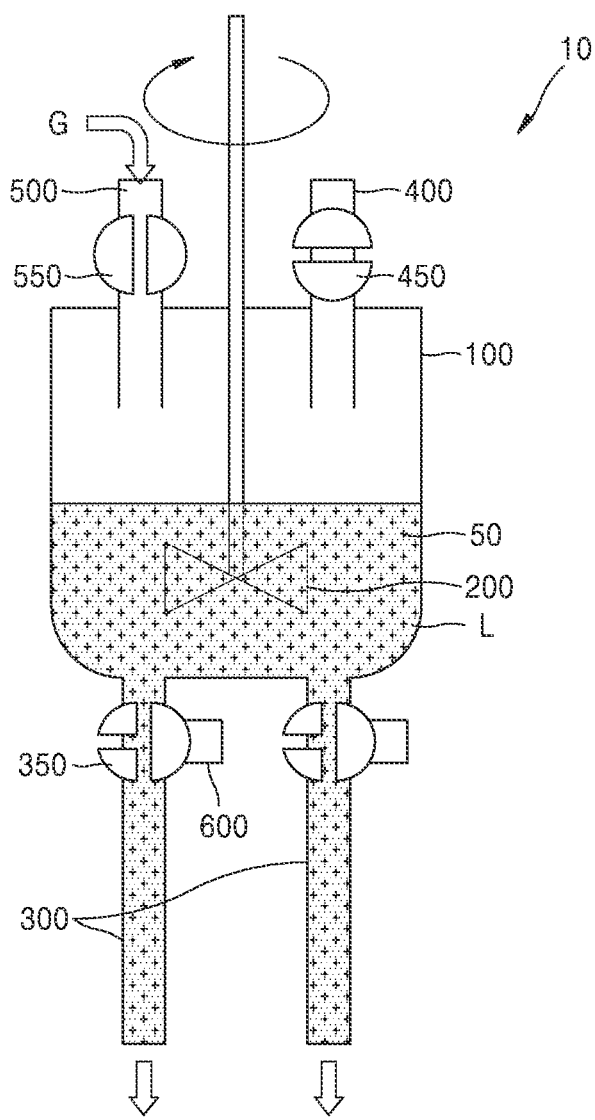
FIG. 6 is a view illustrating a dispenser for a solution according to an example embodiment.

FIG. 6 is a view illustrating a dispenser 10 for a solution according to an example embodiment.

Referring to FIG. 6, the dispenser 10 for a solution may include a plurality of discharge paths 300, and each of the discharge paths 300 may include a valve corresponding to the first valve 350. Because the discharge paths 300 are provided, the micro LED suspension L may be evenly discharged to a substrate having a larger area. A sprayer may be further provided at the end of each discharge path 300, or may be alternately provided at the ends of the discharge path. The valves of the respective discharge paths 300 may be controlled simultaneously or separately.

Figure 7:
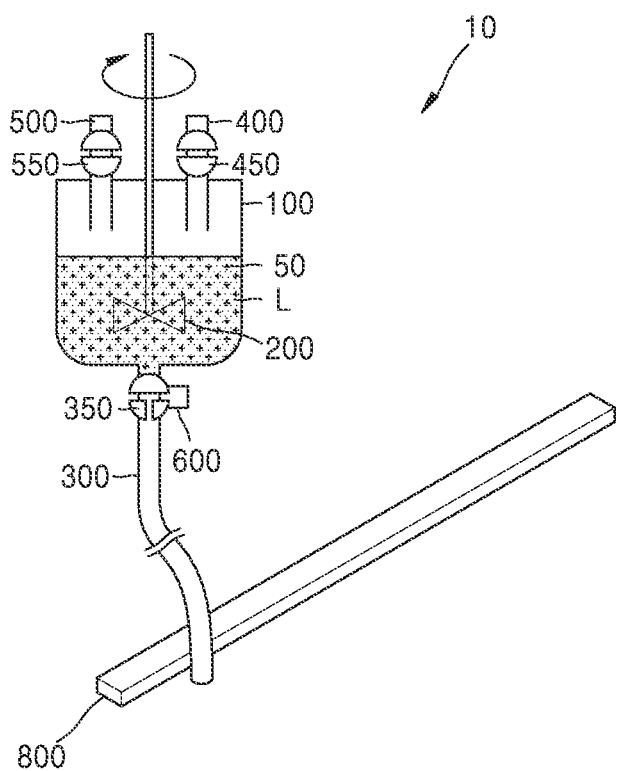
FIG. 7 is a view illustrating a dispenser for a solution according to an example embodiment.

FIG. 7 is a view illustrating a dispenser 10 for a solution according to an example embodiment.

Referring to FIG. 7, the dispenser 10 for a solution may further include a gantry 800. The end of the discharge path 300 may be attached to the gantry 800 in various manners, and such attachment may be temporary or permanent. Also, without being limited to the configuration in which the end of the discharge path 300 is attached to the gantry 800 as in the example embodiment of FIG. 7, the dispenser 10 for a solution itself may be attached to the gantry 800. An end position of the discharge path 300 may be moved by the gantry 800. Such movement may be that the end of the discharge path 300 fixed to one point of the gantry 800 may be moved as the gantry 800 is moved, may be that the gantry 800 is fixed and the end of the discharge path 300 may be moved along a cross section of the gantry 800, or may be that these two may take place at the same time. For example, the gantry 800 may be moved on a substrate by at least one of a translation and a rotation. Also, the end of the discharge path 300 may be moved by at least one of the translation or the rotation along a two-dimensional (2D) cross-section of the gantry 800. However, such movement is not limited to the end of the discharge path 300 attached to the gantry 800, and if the dispenser 10 for a solution is attached to the gantry 800, the dispenser 10 for a solution attached to the gantry 800 may be moved according to movement of the gantry 800 or the dispenser 10 for a solution may be moved along the cross-section of the gantry 800. In other words, the description of the movement of the end of the discharge path 300 attached to the gantry 800 may also be applied to the dispenser 10 for a solution attached to the gantry 800. The gantry 800 of FIG. 7 has a bar-like shape, but is not limited thereto and may have various other shapes. For example, if the gantry 800 has a bar shape, the gantry 800 may have a length same as or longer than a smaller one of a horizontal length or a vertical length of the substrate. However, because the gantry 800 may be disposed to move both horizontally and vertically (or on x-axis and y-axis) on the substrate, the gantry 800 may have a length shorter than a smaller one of the horizontal length or vertical length of the substrate.

If the gantry 800 has a three-dimensional shape including a cross-section of a rectangular parallelepiped, a cross-section of the gantry 800 may be the same as that of the substrate or may be larger or smaller. The gantry 800 may be directly or indirectly connected to the end of the discharge path 300 to help the end of the discharge path 300 move to a position in which the micro LED suspension L is to be discharged to the substrate. A plurality of discharge paths 300 may be connected to one gantry 800, and accordingly, the micro LED suspension L may be discharged to the substrate faster and the micro LED suspension L may be discharged to the substrate having a larger area. Alternatively, the gantry 800 may be connected to the dispenser 10 for a solution itself to help move the dispenser 10 for a solution to a position in which the micro LED suspension L is to be discharged. A plurality of dispensers 10 for a solution may be connected to one gantry 800, so that the micro LED suspension L may be discharged to the substrate faster, and the micro LED suspension L may be discharged to the substrate having a larger area.

The dispenser 10 for a solution according to an example embodiment uniformly discharges the micro LEDs 50 on a substrate, and in particular, because the washing fluid F is introduced through the washing path 600 to remove the micro LEDs 50 remaining in the discharge path 300, a constant discharge amount per hour may be maintained even after several discharge processes, thereby increasing fixing yield.

Hereinafter, a method of transferring a micro LED using the dispenser 10 for a solution will be described.

The method of transferring the micro LED 50 to a substrate 900 may include preparing the substrate 900, discharging the micro LED suspension L through the discharge path 300 using the dispenser 10 for a solution, aligning the micro LEDs 50 discharged to the substrate 900 in the FSA manner, washing the discharge path 300 using the washing fluid F introduced through the washing path 600, and filling the reservoir 100.

Figure 8A:
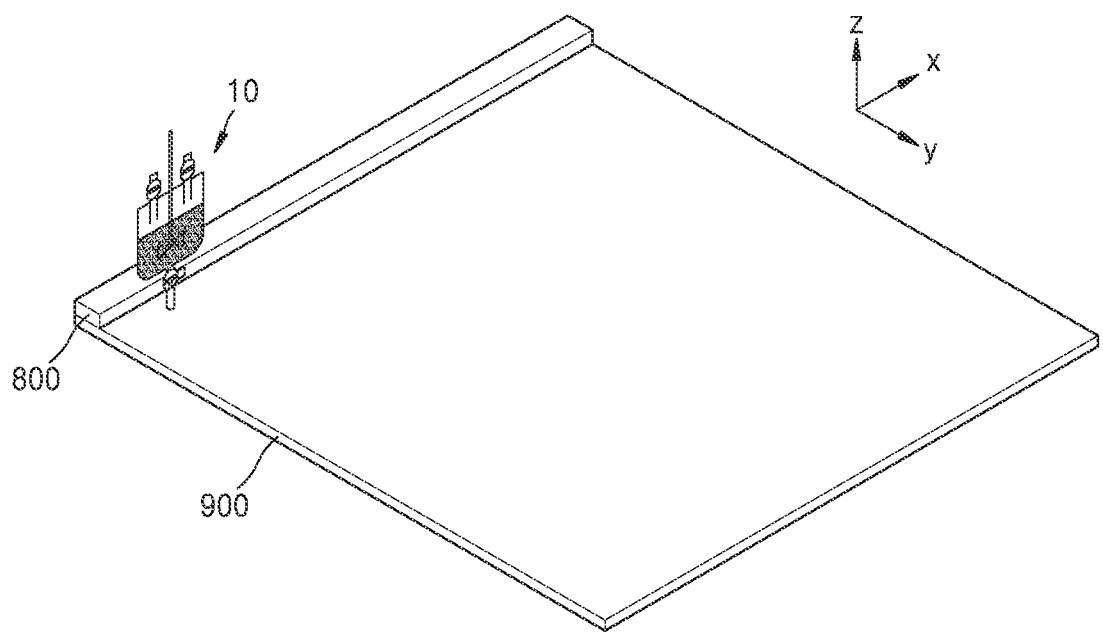
FIG. 8A is a view illustrating a state in which a dispenser for a solution according to an example embodiment is connected to a gantry and positioned on a substrate and is in a standby mode before discharging.
Figure 8B:
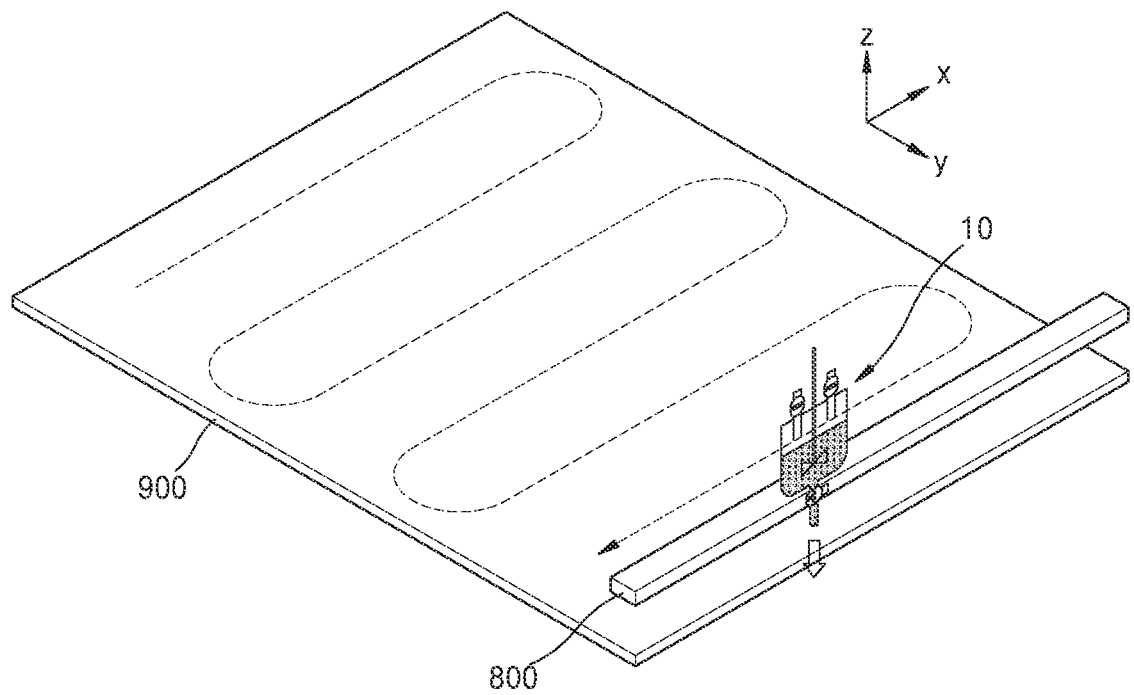
FIG. 8B is a view illustrating a discharge mode in which a micro LED suspension L is discharged on a substrate through a dispenser for a solution according to an example embodiment.
Figure 8C:
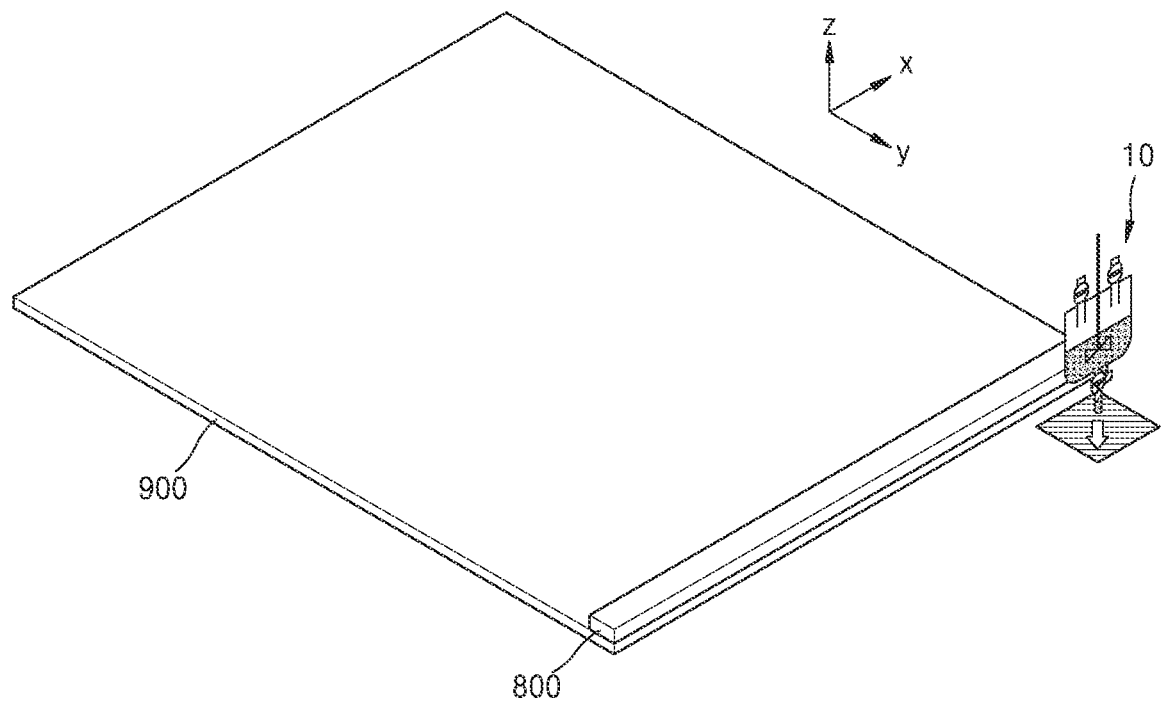
FIG. 8C is a view illustrating that a discharge path is washed in a standby mode in a standby region of a dispenser for a solution according to an example embodiment.
Figure 8D:
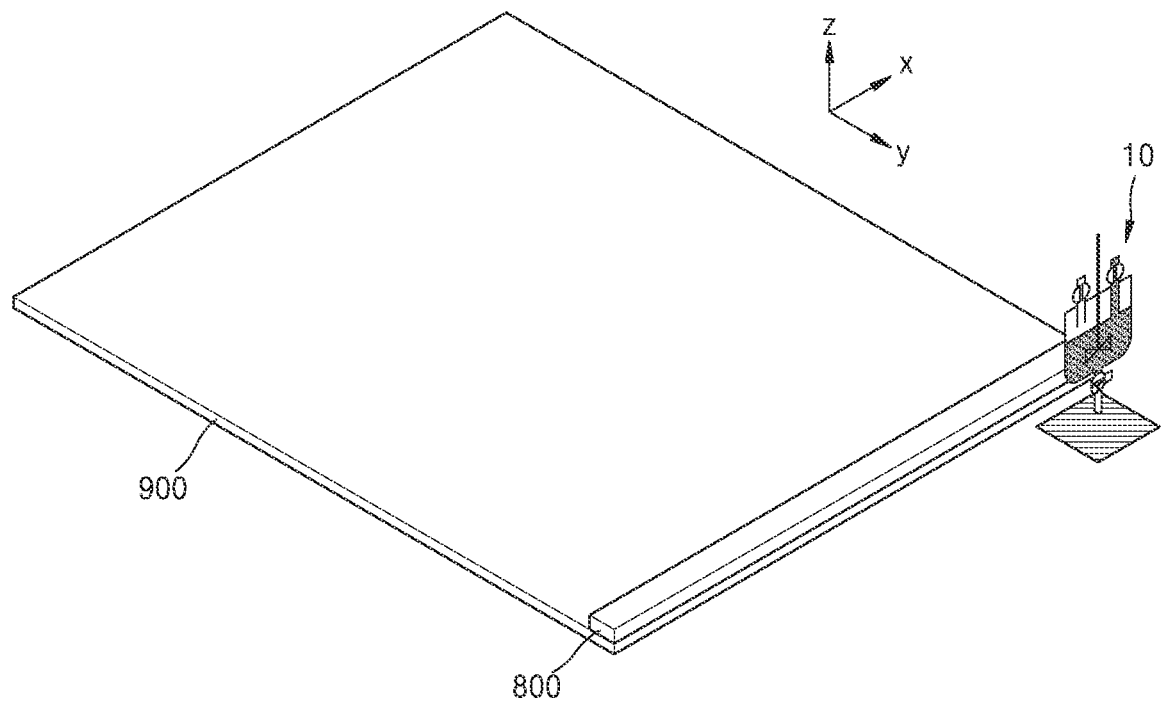
FIG. 8D is a view illustrating that a dispenser for a solution according to an example embodiment is in a filling mode in a standby region.
Figure 8E:
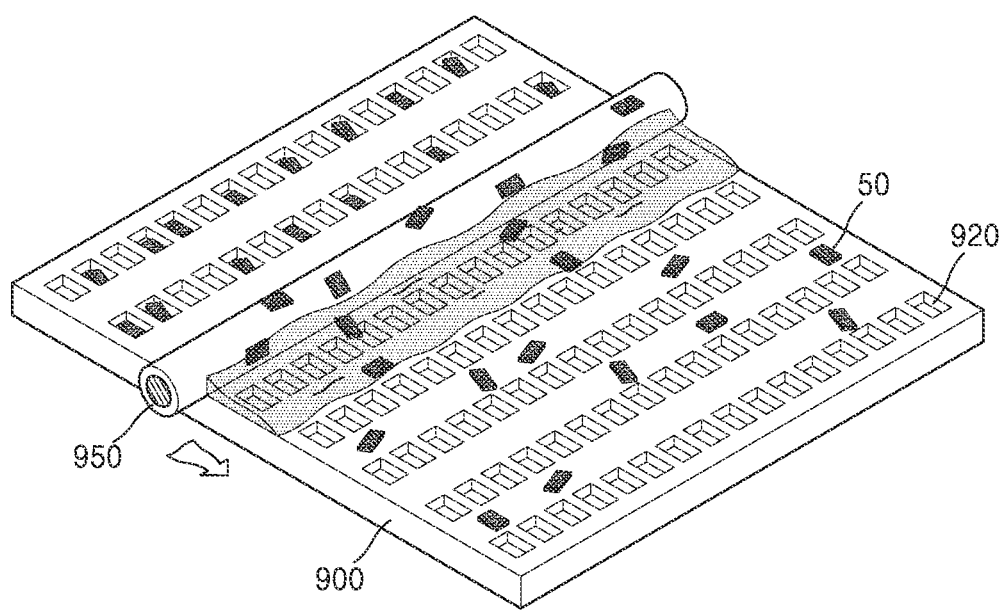
FIG. 8E is a view illustrating a process performed after a suspension is discharged onto a substrate by a dispenser for a solution according to an example embodiment.

FIG. 8A is a view illustrating a state in which the dispenser 10 for a solution according to an example embodiment is connected to the gantry 800 and positioned on the substrate 900 in a standby mode before discharging, FIG. 8B is a view illustrating a discharge mode in which the micro LED suspension L is discharged on the substrate through the dispenser 10 for a solution according to an example embodiment, FIG. 8C is a view illustrating that the discharge path 300 is washed in the standby mode in a standby region of the dispenser 10 for a solution according to an example embodiment, FIG. 8D is a view illustrating that the dispenser 10 for a solution according to an example embodiment is in the filling mode in the standby region, and FIG. 8E is a view illustrating a process performed after the suspension L is discharged onto the substrate by the dispenser 10 for a solution according to an example embodiment.

The substrate 900 according to FIGS. 8A to 8E may be an interposer used for transfer to another substrate or a driving substrate including a driving layer, but is not limited thereto, and may be a substrate having various roles. Here, the substrate 900 may include a plurality of wells 920 (see, e.g., FIG. 8E) in which the micro LEDs 50 are fixed.

Referring to FIGS. 1 and 8A, the dispenser 10 for a solution itself may be connected to the gantry 800 and disposed on the substrate 900. When positioned, the dispenser 10 for a solution may be in the standby mode. The dispenser 10 for a solution may be moved along the gantry 800 in an x-axis or −x-axis direction, and the gantry 800 may be moved in a y-axis or −y-axis direction. In the standby mode, the micro LED suspension L stored in the reservoir 100 may be maintained at a uniform concentration using the stirrer 200.

Referring to FIGS. 2 and 8B, the dispenser 10 for a solution may be switched to the discharge mode as the discharge path 300 is opened with respect to the reservoir 100 through the first valve 350 and the third valve 550 is opened. The gas G may be introduced into the reservoir 100 through the hydraulic path 500, and accordingly, a constant pressure may be maintained in the reservoir 100, so that the micro LED suspension L may be uniformly discharged onto the substrate 900. As the dispenser 10 for a solution is moved along the gantry 800, the micro LED suspension L may be discharged onto the substrate 900 in the x-axis direction. After the dispenser 10 for a solution is moved from a first end to a second end along the x-axis of the gantry 800, the gantry 800 itself may be moved in the y-axis direction and the dispenser 10 for a solution may be moved from the second end to the first end along the −x axis. However, the movement is not limited to such a zigzag movement, but may be various types of movement. For example, when the dispenser 10 for a solution is moved from the first end to the second end along the x-axis of the gantry 800, the dispenser 10 for a solution may be switched to the standby mode, and when the dispenser 10 for a solution moves along the −x axis to return to the first end again and the gantry 800 is moved along the y-axis, the dispenser 10 for a solution may be switched back to the discharge mode and may be moved from the first end to the second end. Also, in the discharge mode, when the gantry 800 first moves along the y-axis and then reaches the end of the y-axis direction, the dispenser 10 for a solution is slightly moved in the x-axis direction and the gantry 800, moved in the −y-axis, reaches the y-axis direction end, which may be repeated.

The dispenser 10 for a solution may include a path generator system therein to receive a trace input by the internal system, or may be connected to an external system to receive a trace input through the external system. The gantry 800 may be moved in a translation or rotation according to the received trace, and the dispenser 10 for a solution connected to the gantry 800 may be moved by the translation or the rotation along the 2D cross-section of the gantry.

As in the standby mode, the micro LED suspension L stored in the reservoir 100 may be maintained at a uniform concentration using the stirrer 200 also in the discharge mode.

Referring to FIGS. 3 and 8C, the dispenser 10 for a solution, after discharging the micro LED suspension L onto the substrate 900, may be switched to the standby mode. The dispenser 10 for a solution may enter the standby mode as the discharge path 300 may be closed with respect to the reservoir 100 through the first valve 350 and the third valve 550 is closed, and the discharge path 300 may be opened with respect to the washing path 600 through the first valve 350. The dispenser 10 for a solution may be located in the standby region. The standby region may correspond to a separate region other than above the substrate 900 as shown in FIG. 8C. In order to remove the micro LED 50 remaining in the discharge path 300 on the standby region, the washing fluid F may be introduced through the washing path 600. The introduced washing fluid F removes the micro LED 50 in the discharge path 300 to prevent partial or entire closure of the discharge path 300. A net may be provided in the standby region to recycle the removed micro LED 50. Here, a grid spacing of the net may be smaller than a size of the micro LED 50. The micro LED 50 filtered through the net may be re-suspended in the suspension L solvent and recycled.

Referring to FIGS. 4 and 8D, the dispenser 10 for a solution may be switched to the filling mode. The second valve 450 may be opened and the micro LED suspension L may be supplied into the reservoir 100 through the filling path 400. The third valve 550 may be opened to allow the gas G inside the reservoir 100 to be drawn out, and the inside of the reservoir 100 may be induced to a vacuum state or a low-pressure state. After the discharge path 300 is washed in the standby mode in the standby region, the mode may be switched to the filling mode, or after filling is performed in the filling mode, the mode may be switched to the standby mode and washing may be performed. In addition, the washing and filling modes may be operated simultaneously.

As in the standby mode, the micro LED suspension L stored in the reservoir 100 may be maintained at a uniform concentration using the stirrer 200 even in the filling mode.

As illustrated in FIG. 8E, after the solution is discharged onto the substrate 900 by the dispenser 10 for a solution, the micro LEDs 50 may be aligned in the FSA manner. The micro LED 50 alignment operation may be performed after the suspension L discharging operation, and may be performed regardless of the order of the washing operation or the filling operation. During the discharge process, the micro LEDs 50 may be located or transferred to the wells 920 of the substrate 900, respectively. In addition, the micro LEDs 50 may be located or transferred to the wells 920 of the substrate 900 as a blade, a roller, or an absorber 950 scans on the substrate 900. Here, the micro LED suspension L may be uniformly discharged onto the substrate 900 using the dispenser 10 for a solution, so that fixing yield may be increased. In a subsequent process, for example, if the substrate 900 is a driving substrate including a driving layer, the located micro LED 50 may be temporarily fixed to the well 920 through low-temperature solder or the like, an electrode structure may be formed thereon through patterning or the like, and a passivation layer may be formed thereon. For example, if the substrate 900 is an interposer, the located micro LED 50 may be located or transferred to another substrate again, which may be implemented through various methods.

Figure 9A:
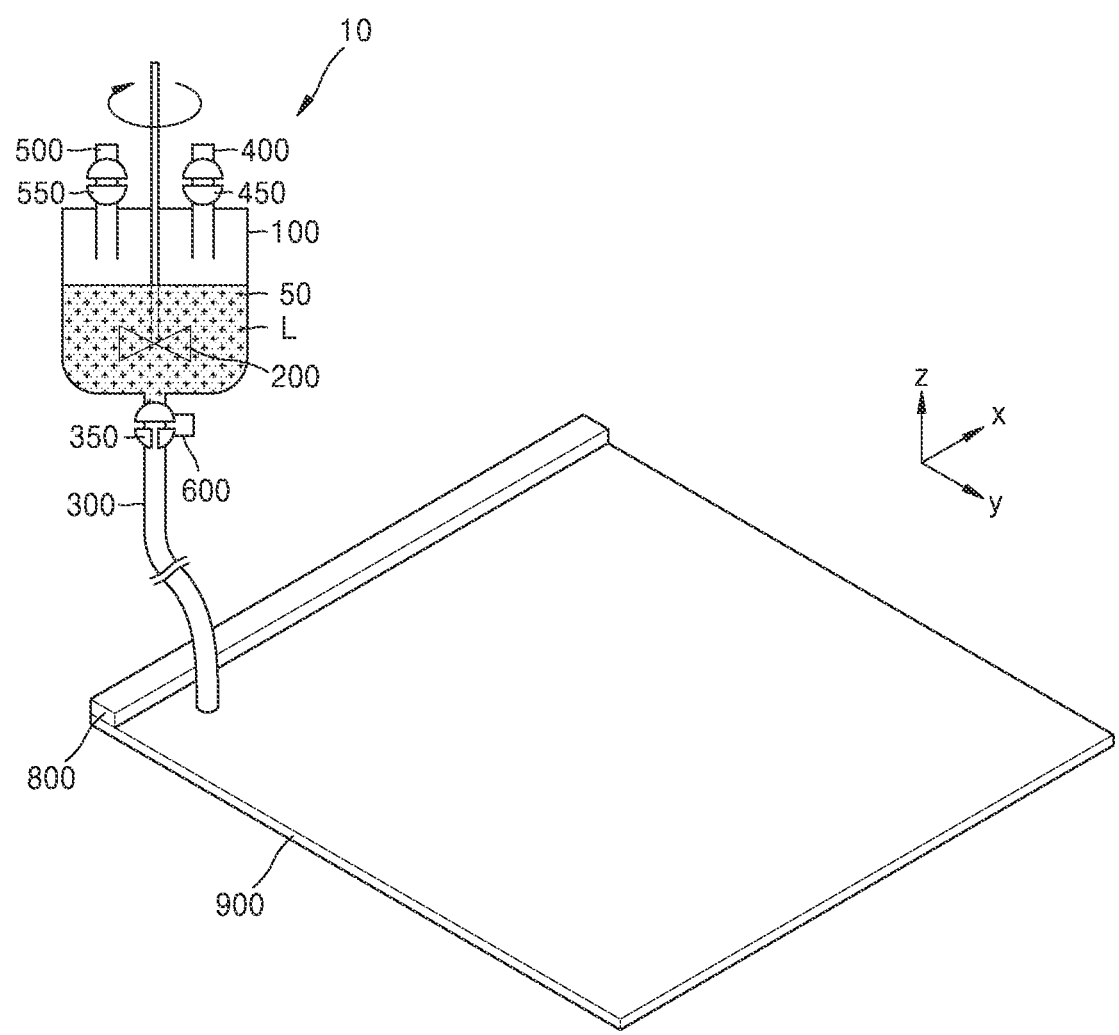
FIG. 9A is a view illustrating a state in which an end of a discharge path of a dispenser for a solution according to an example embodiment is connected to a gantry, is positioned on a substrate, and is in a standby mode before discharging.
Figure 9B:
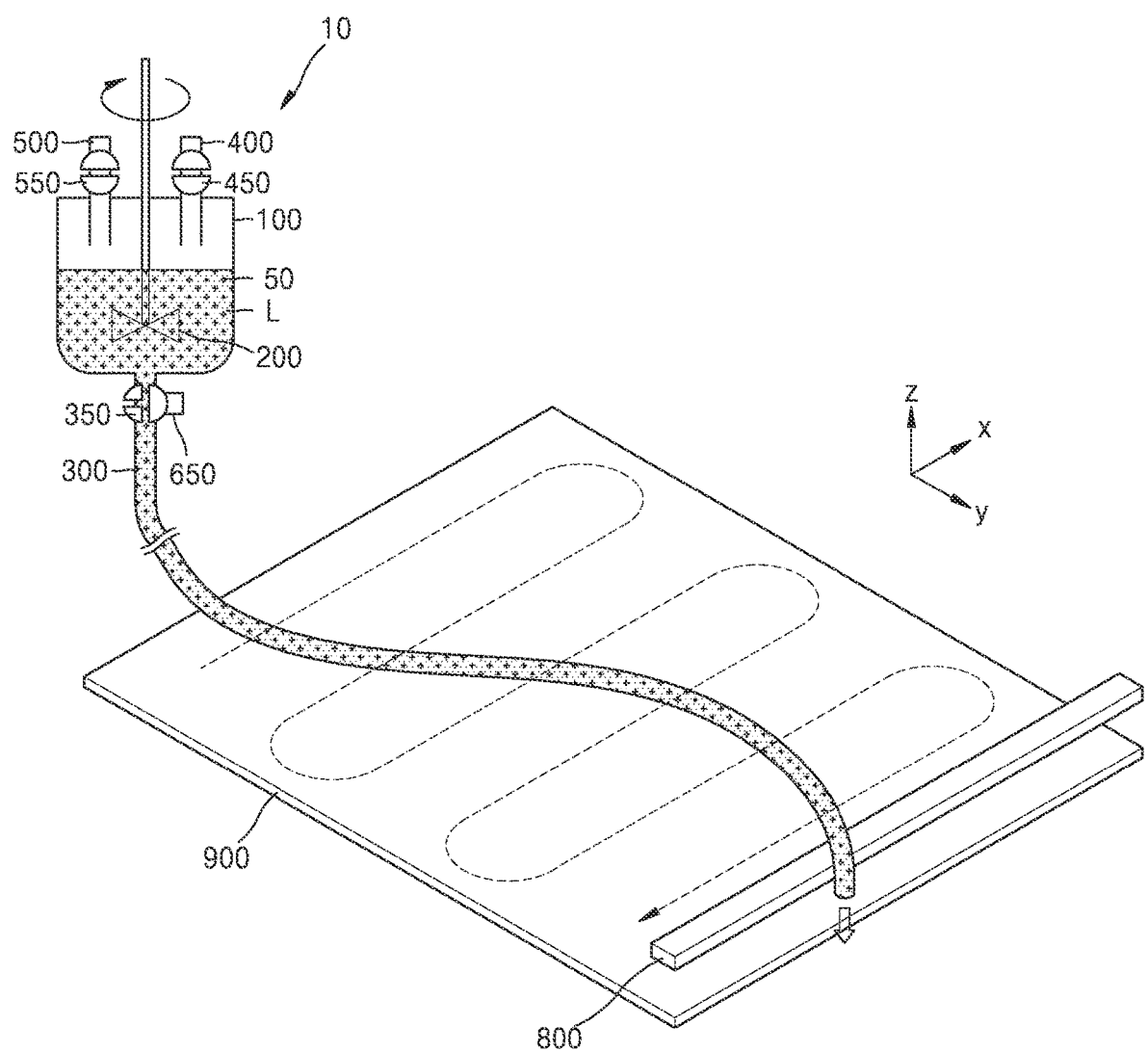
FIG. 9B is a view illustrating a discharge mode in which a micro LED suspension is discharged onto a substrate through a dispenser for a solution according to an example embodiment.
Figure 9C:
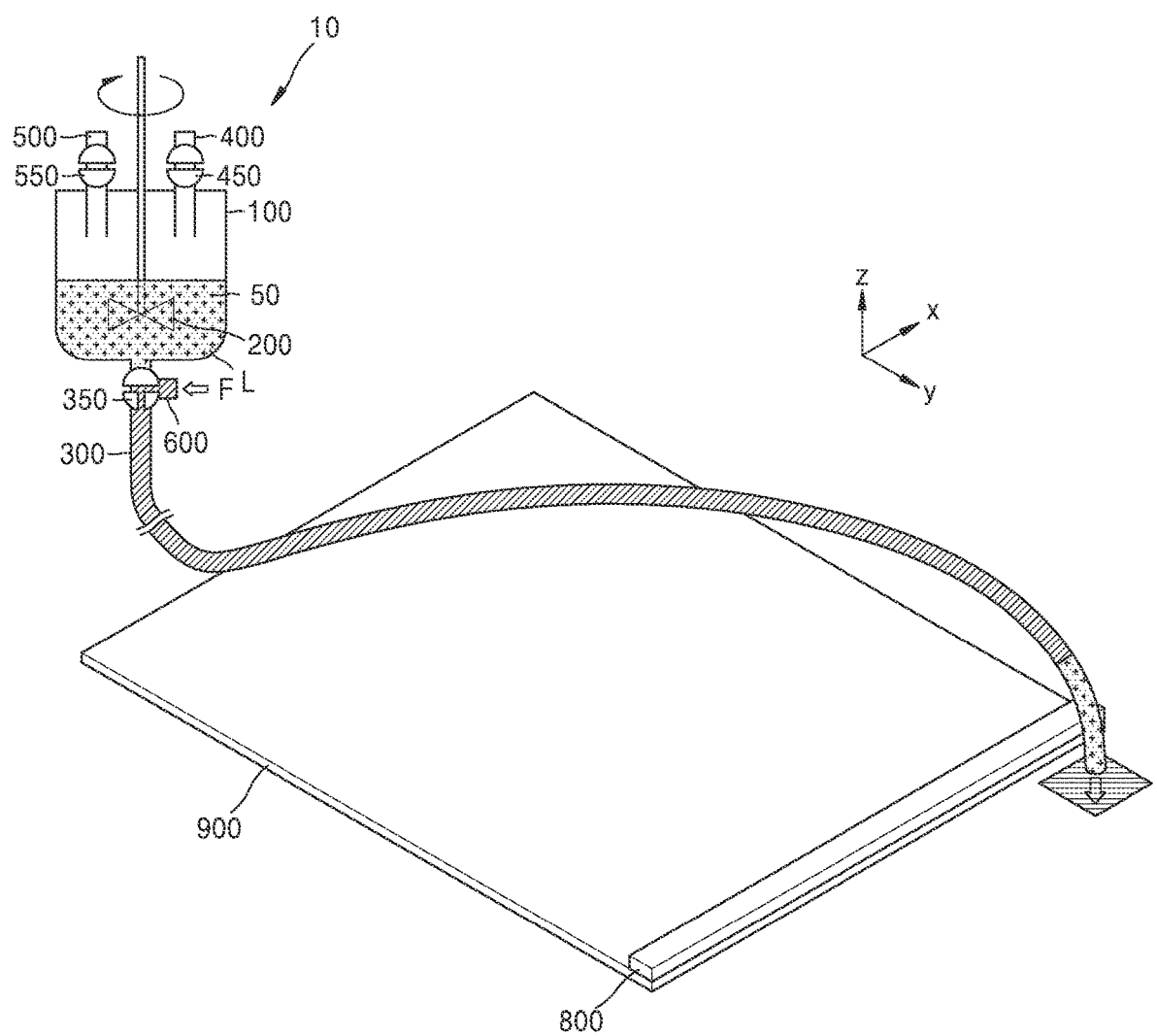
FIG. 9C is a view illustrating that an end of a discharge path of a dispenser for a solution according to an example embodiment is positioned in a standby region and a discharge path is washed.
Figure 9D:
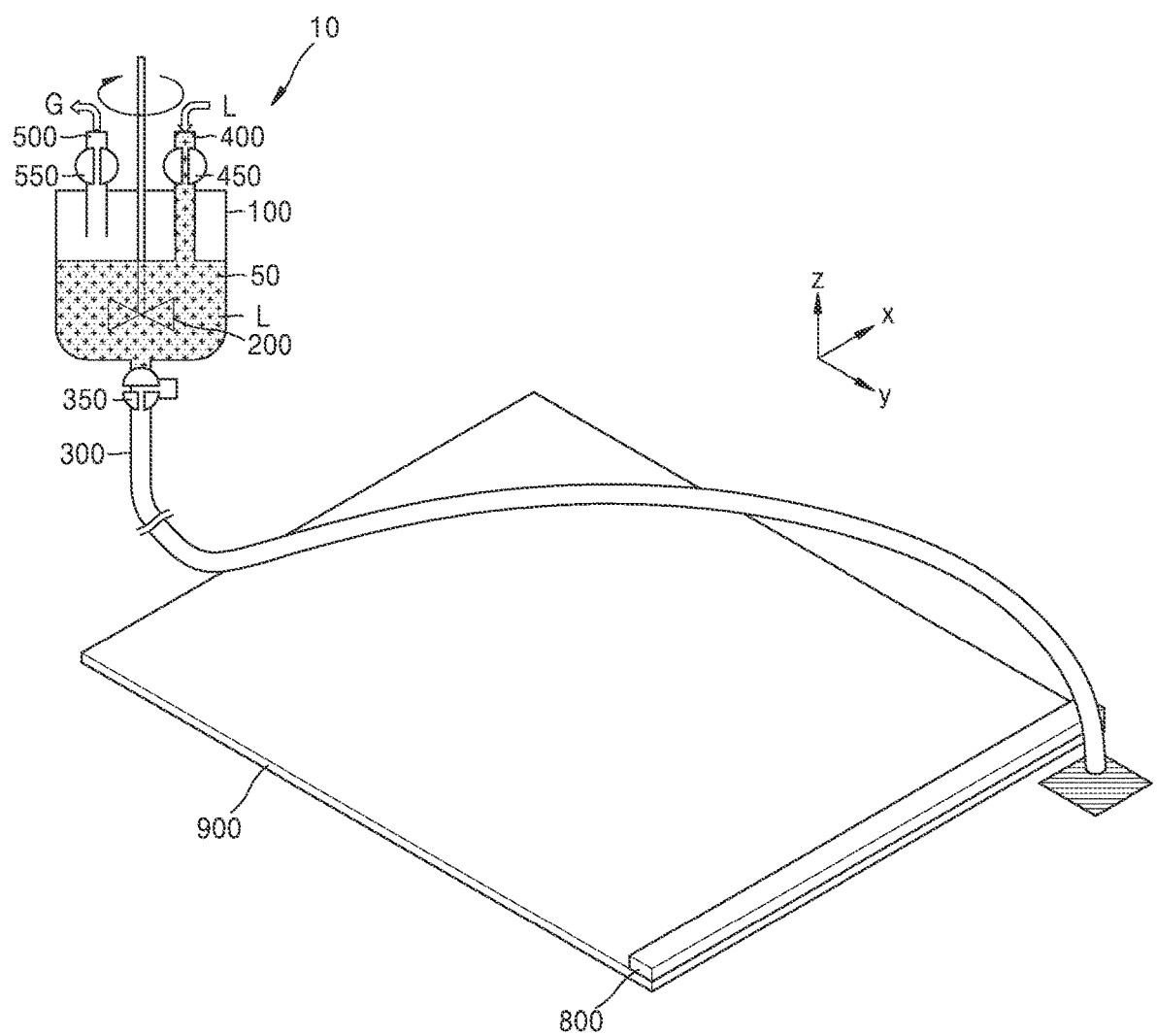
FIG. 9D is a view illustrating that an end of a discharge path of a dispenser for a solution according to an example embodiment is positioned in a standby region and a dispenser for a solution is in a filling mode.

FIG. 9A is a view illustrating a state in which the end of the discharge path 300 of the dispenser 10 for a solution according to an example embodiment is connected to the gantry 800 and positioned on the substrate 900 in a standby mode before discharging, FIG. 9B is a view illustrating the discharge mode in which the micro LED suspension L is discharged on the substrate 900 through the dispenser 10 for a solution according to an example embodiment, FIG. 9C is a view illustrating that the end of the discharge path 300 of the dispenser 10 for a solution according to an example embodiment is positioned in the standby region and the discharge path 300 is washed, and FIG. 9D is a view illustrating that the end of the discharge path 300 of the dispenser 10 for a solution according to an example embodiment is positioned in the standby region and the dispenser 10 for a solution is in the filling mode.

The example embodiments of FIGS. 9A to 9D show that the dispenser 10 for a solution itself is not connected to the gantry 800 but the end of the discharge path 300 is connected to the gantry 800 and the processes are performed. Other contents may be similar to those of FIGS. 8A to 8D.

Referring to FIG. 9A, the end of the discharge path 300 of the dispenser 10 for a solution may be connected to the gantry 800 and disposed on the substrate 900. When positioned, the dispenser 10 for a solution may be in the standby mode. The end of the discharge path 300 may be moved along the gantry 800 in the x-axis or −x-axis direction, and the gantry 800 may be moved in the y-axis or the −y-axis direction. In the standby mode, the micro LED suspension L stored in the reservoir 100 may be maintained at a uniform concentration using the stirrer 200.

Referring to FIG. 9B, the dispenser 10 for a solution may be switched to the discharge mode as the discharge path 300 is opened with respect to the reservoir 100 through the first valve 350 and the third valve 550 is opened. The gas G may be introduced into the reservoir 100 through the hydraulic path 500, and accordingly, a constant pressure may be maintained in the reservoir 100, so that the micro LED suspension L may be uniformly discharged onto the substrate 900. As the discharge path 300 is moved along the gantry 800, the micro LED suspension L may be discharged onto the substrate 900 in the x-axis direction. After the discharge path 300 is moved from the first end to the second end along the x-axis of the gantry 800, the gantry 800 itself may be moved in the y-axis direction, and the discharge path 300 may be moved from the second end to the first end along the −x axis. However, the movement is not limited to such a zigzag movement, but may be various types of movement. For example, when the discharge path 300 is moved from the first end to the second end along the x-axis of the gantry 800, the dispenser 10 for a solution may be switched to the standby mode, and when the discharge path 300 is moved along the −x axis to return to the first end again and the gantry 800 is moved along the y-axis, the dispenser 10 for a solution may be switched back to the discharge mode and the discharge path 300 may be moved from the first end to the second end. Also, in the discharge mode, when the gantry 800 first moves along the y-axis and then reaches the end of the y-axis direction, the discharge path 300 may be slightly moved in the x-axis direction and the gantry 800, moved in the −y-axis, reaches the −y-axis direction end, which may be repeated.

The dispenser 10 for a solution may include a path generator system therein to receive a trace input by the internal system, or may be connected to an external system to receive a trace input through the external system. The gantry 800 may be moved in a translation or rotation according to the received trace, and the end of the discharge path 300 connected to the gantry 800 may be moved by the translation or the rotation along the 2D cross-section of the gantry.

As in the standby mode, the micro LED suspension L stored in the reservoir 100 may be maintained at a uniform concentration using the stirrer 200 also in the discharge mode.

Referring to FIG. 9C, the dispenser 10 for a solution, after discharging the micro LED suspension L onto the substrate 900, may be switched to the standby mode. The dispenser 10 for a solution may enter the standby mode as the discharge path 300 may be closed with respect to the reservoir 100 through the first valve 350 and the third valve 550 is closed, and the discharge path 300 may be opened with respect to the washing path 600 through the first valve 350. The end of the discharge path 300 of the dispenser 10 for a solution may be located in the standby region. The standby region may correspond to a separate region other than above the substrate 900. In order to remove the micro LED 50 remaining in the discharge path 300 on the standby region, the washing fluid F may be introduced through the washing path 600. The introduced washing fluid F removes the micro LED 50 in the discharge path 300 to prevent partial or entire closure of the discharge path 300. A net may be provided in the standby region to recycle the removed micro LED 50. Here, a grid spacing of the net may be smaller than a size of the micro LED 50. The micro LED 50 filtered through the net may be re-suspended in the suspension L solvent and recycled.

Referring to FIG. 9D, the dispenser 10 for a solution may be switched to the filling mode. The second valve 450 may be opened and the micro LED suspension L may be supplied into the reservoir 100 through the filling path 400. The third valve 550 may be opened to allow the gas G inside the reservoir 100 to be drawn out, and the inside of the reservoir 100 may be induced to a vacuum state or a low-pressure state. After the discharge path 300 is washed in the standby mode in the standby region, the mode may be switched to the filling mode, or after filling is performed in the filling mode, the mode may be switched to the standby mode and washing may be performed. In addition, the washing and filling modes may be operated simultaneously.

When the dispenser for a solution according to one or more embodiments discharges a solution, a constant pressure may be maintained in the reservoir through a hydraulic path, and thus, the solution may be uniformly discharged.

In addition, in the dispenser for a solution according to one or more embodiments, the micro LED suspension is supplied to the reservoir through the filling path, the suspension of the same amount and the same concentration before and after the entire process may be stored in the reservoir.

Furthermore, the dispenser for a solution according to one or more embodiments may prevent a decrease in uniformity of solution discharging by removing the micro LED remaining in the discharge path by introducing the washing fluid through the washing path.

It should be understood that the example embodiments described herein should be considered in a descriptive sense only and not for purposes of limitation. Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A dispenser for a solution, the dispenser comprising:
    a reservoir configured to hold a suspension of micro light-emitting diodes (LEDs) suspended in a solvent;
    a stirrer configured to stir the suspension in the reservoir;
    a discharge path comprising a first valve configured to control outflow of the suspension from the reservoir;
    a filling path comprising a second valve configured to control inflow of the suspension into the reservoir;
    a hydraulic path comprising a third valve configured to control a pressure inside the reservoir; and
    a washing path connected to the first valve, the washing path being configured to input a washing fluid into the discharge path for washing the discharge path,
    wherein the first valve comprises a multi-way valve configured to selectively connect the discharge path to one of the reservoir and the washing path,
    wherein the washing path is configured to input the washing fluid into the discharge path when there is no outflow of the suspension from the reservoir, to remove the micro LEDs from the discharge path.

2. The dispenser of claim 1, wherein the micro LEDs have a size of 1 μm to 500 μm.

3. The dispenser of claim 1, wherein the first valve comprises a two-way valve.

4. The dispenser of claim 1, wherein the each of the second valve and the third valve is a two-way valve.

5. The dispenser of claim 1, wherein the third valve is configured to cause a gas to be injected into the reservoir according to the outflow of the suspension from the reservoir through the discharge path.

6. The dispenser of claim 1, wherein the first valve is configured to, when selectively connecting the discharge path to the washing path, input the washing fluid into the discharge path to remove micro LEDs present in the discharge path.

7. The dispenser of claim 1, wherein the second valve is configured to selectively input the suspension to the reservoir through the filling path, and
wherein the third valve is configured to cause a gas to be drawn from the reservoir by inducing a vacuum state or a low-pressure state in the reservoir.

8. The dispenser of claim 1, wherein the washing fluid comprises at least one of gas, water, ethanol, and a surfactant.

9. The dispenser of claim 1, further comprising a sprayer disposed at an end of the discharge path, the sprayer being configured to spray the suspension being discharged through the discharge path.

10. The dispenser of claim 1, further comprising a plurality of discharge paths.

11. The dispenser of claim 1, further comprising a gantry connected to the dispenser, the gantry being configured to move by at least one of a translation and a rotation on a substrate.

12. The dispenser of claim 11, wherein the discharge path is configured to discharge the suspension onto the substrate.

13. The dispenser of claim 11, wherein the stirrer comprises a magnetic bar.

14. The dispenser of claim 1, wherein the stirrer comprises an impeller, and
wherein the impeller comprises at least one of a paddle, a propeller, a screw, and a turbine.

* * * * *